(12) United States Patent
Zhang et al.

(10) Patent No.: US 7,883,953 B2
(45) Date of Patent: Feb. 8, 2011

(54) METHOD FOR TRANSISTOR FABRICATION WITH OPTIMIZED PERFORMANCE

(75) Inventors: Da Zhang, Hopewell Junction, NY (US); Voon-Yew Thean, Austin, TX (US); Christopher V. Baiocco, Newburgh, NY (US); Jie Chen, Singapore (SG); Weipeng Li, Beacon, NY (US); Young Way Teh, Singapore (SG); Jin Wallner, Pleasant Valley, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/242,078

(22) Filed: Sep. 30, 2008

(65) Prior Publication Data

US 2010/0078687 A1   Apr. 1, 2010

(51) Int. Cl.
*H01L 21/8238* (2006.01)
(52) U.S. Cl. .................................. 438/199; 257/288
(58) Field of Classification Search ............... 438/199; 257/288
See application file for complete search history.

(56) References Cited

U.S. PATENT DOCUMENTS

| | | | |
|---|---|---|---|
| 7,288,451 B2 | 10/2007 | Zhu et al. | |
| 2005/0093030 A1* | 5/2005 | Doris et al. | 257/288 |
| 2006/0237785 A1* | 10/2006 | Ieong et al. | 257/338 |
| 2007/0102755 A1 | 5/2007 | Adams et al. | |
| 2007/0295973 A1* | 12/2007 | Jinbo et al. | 257/88 |
| 2008/0293195 A1* | 11/2008 | Krivokapic | 438/199 |

* cited by examiner

*Primary Examiner*—Zandra Smith
*Assistant Examiner*—Jamie Niesz
(74) *Attorney, Agent, or Firm*—Hamilton & Terrile, LLP; Michael Rocco Cannatti

(57) ABSTRACT

A semiconductor process and apparatus includes forming <100> channel orientation CMOS transistors (24, 34) with enhanced hole mobility in the NMOS channel region and reduced channel defectivity in the PMOS region by depositing a first tensile etch stop layer (51) over the PMOS and NMOS gate structures, etching the tensile etch stop layer (51) to form tensile sidewall spacers (62) on the exposed gate sidewalls, and then depositing a second hydrogen rich compressive or neutral etch stop layer (72) over the NMOS and PMOS gate structures (26, 36) and the tensile sidewall spacers (62). In other embodiments, a first hydrogen-rich etch stop layer (81) is deposited and etched to form sidewall spacers (92) on the exposed gate sidewalls, and then a second tensile etch stop layer (94) is deposited over the NMOS and PMOS gate structures (26, 36) and the sidewall spacers (92).

18 Claims, 4 Drawing Sheets

METHOD FOR TRANSISTOR FABRICATION WITH OPTIMIZED PERFORMANCE

BACKGROUND OF THE INVENTION

1. Field of the Invention

The present invention is directed in general to the field of semiconductor fabrication and integrated circuits. In one aspect, the present invention relates to complementary metal oxide semiconductor (CMOS) field effect transistors (Fêtes) fabricated with strained semiconductor channel regions

2. Description of the Related Art

CMOS devices, such as NMOS or PMOS transistors, have conventionally been fabricated on semiconductor wafers with a surface crystallographic orientation of (100), and its equivalent orientations, e.g., (010), (001), (00-1). The devices may be fabricated with a <100> crystal channel orientation (i.e., on 45 degree rotated wafer or substrate). The channel defines the dominant direction of electric current flow through the device, and the mobility of the carriers generating the current determines the drive performance of the devices. While it is possible to improve carrier mobility by intentionally stressing the channels of NMOS and/or PMOS transistors, it is difficult to simultaneously improve the carrier mobility for both types of devices formed on a uniformly-strained substrate because PMOS carrier mobility and NMOS carrier mobility are optimized under different types of stress. For example, those skilled in the art have discovered that electron mobility for NMOS devices having <100> oriented channels may be improved by intentionally implementing a tensile stress in NMOS transistor channels to improve carrier mobility, but PMOS devices are insensitive to any uneasily stress in the channel direction. Some CMOS device fabrication processes have addressed the different requirements by fabricating different stress layers for the NMOS and PMOS devices, but this adds processing complexity to the fabrication, especially where separate masking is required for formation of the NMOS and PMOS devices. Moreover, the selection of stress conditions for each type of device is complicated by the fact that stress conditions that optimize carrier mobility may negatively impact other device characteristics, such as threshold voltage, thereby.

To avoid processing complexity, other CMOS device fabrication processes have applied a single tensile contact etch stop layer over both NMOS and PMOS devices fabricated on substrates with <100> channel orientation. While this approach improves the NMOS device mobility, it provides relatively little strain enhancement for the PMOS devices, and does not provide a mechanism for addressing channel directivity or interface trap density (DIT) in the PMOS devices. This approach can also result in the formation of voids when the tensile contact etch stop layer is deposited over the closely spaced transistor structures. This is shown in FIG. 1 which illustrates a partial cross-sectional view of a semiconductor wafer structure 100 in which a single tensile contact etch stop layer 105 is formed over a plurality of closely-spaced transistor structures (including gates 102, spacers 103 and source/drain regions 104 formed in the substrate 101), where the reduced spacing between transistor structures (due in part to the relatively wide spacers 103) causes voids 106 to be formed in the tensile contact etch stop layer 105.

Accordingly, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
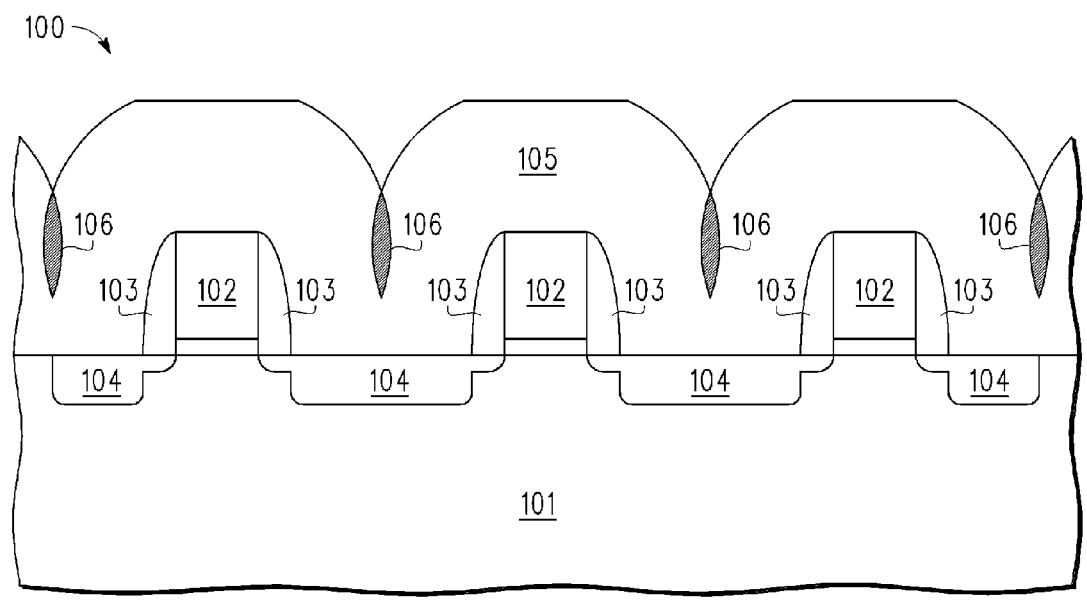
FIG. 1 illustrates a partial cross-sectional view of a semiconductor wafer structure in which voids are formed in the tensile contact etch stop layer.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A semiconductor fabrication process and resulting integrated circuit are described for manufacturing high performance CMOS transistor devices on a semiconductor wafer substrate having a common channel orientation for both PMOS and NMOS devices formed on silicon substrate having a <100> channel orientation (i.e., on 45 degree rotated wafer or substrate). By using a single or common void less stressing structure for both PMOS and NMOS devices, the channel stress conditions of the NMOS and PMOS devices in a semiconductor wafer are selectively controlled to produce an integrated circuit having stress conditions that are favorable for both NMOS and PMOS devices with reduced interface trap density in the PMOS devices. In selected embodiments, the void less stressing structure is formed on both the NMOS and PMOS devices by first removing the implant spacer from the NMOS and PMOS transistor devices, and then forming tensile sidewall spacers on the NMOS and PMOS transistor devices, followed by formation of a neutral or compressive stress contact etch stop layer over the NMOS and PMOS transistor devices. The tensile sidewall spacers are sized to prevent voiding from occurring when the subsequent neutral or compressive stress contact etch stop layer is deposited, while at the same time providing tensile strain for the NMOS channel regions. In addition, the thickness of the neutral or compressive stress contact etch stop layer is controlled to prevent the formation of voids, while at the same time providing a source of hydrogen that improves the interface trap density (DIT) to reduce channel directivity in the PMOS devices. In other embodiments, the void less stressing structure is formed on both the NMOS and PMOS devices by first removing the implant spacer from the NMOS and PMOS transistor devices, and then forming neutral or compressive sidewall spacers on the NMOS and PMOS transistor devices, followed by formation of a tensile stress contact etch stop layer over the NMOS and PMOS transistor devices. The neutral or compressive sidewall spacers are sized to prevent voiding from occurring when the subsequent tensile stress contact etch stop layer is deposited and to provide a source of hydrogen that improves the interface trap density (DIT) in the PMOS devices. In addition, the thickness of the tensile stress contact etch stop layer is controlled to prevent the formation of voids, while at the same time providing tensile strain for the NMOS channel regions. By using the same integration flow and etch stop layer stressor structures for both NMOS and PMOS transistor devices, there is no need for separate masking, etching and treatments steps for the NMOS and PMOS areas.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device that are not necessarily drawn to scale and that do not include every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 2:
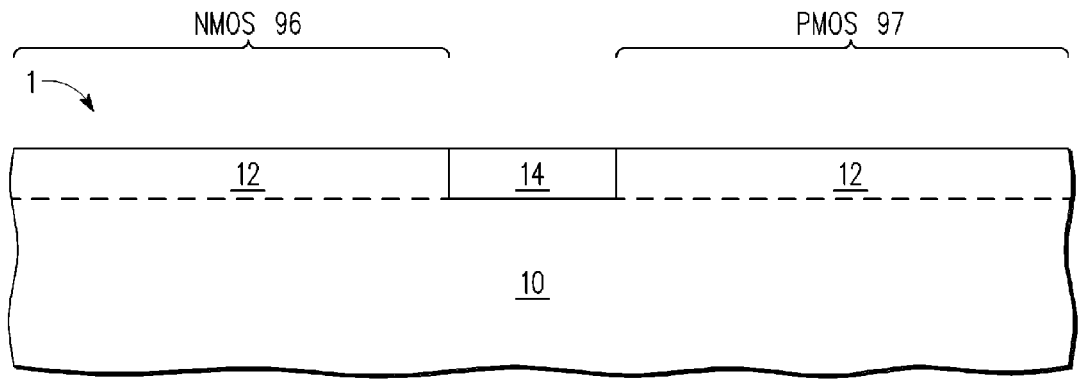
FIG. 2 is a partial cross-sectional view of a semiconductor wafer structure including a semiconductor layer having isolated NMOS and PMOS device areas.

Referring now to FIG. 2, there is shown a partial cross-sectional view of a semiconductor wafer structure 1. The structure 1 includes a semiconductor layer 12 formed on or as part of a semiconductor substrate 10 that has a first crystallographic orientation. Also illustrated is a shallow trench isolation 14 that divides the layer 12 into separate regions. Depending on the type of transistor device being fabricated, the semiconductor layer 10, 12 may be implemented as a bulk silicon substrate, single crystalline silicon (doped or undoped), SOI substrate, or any semiconductor material including, for example, Si, Sic, Sage, Sigel, Gee, GaAs, Incas, Imp, as well as other III/V or II/VI compound semiconductors or any combination thereof, and may optionally be formed as the bulk handling wafer. The semiconductor layer 10, 12 has a channel crystallographic orientation of <100>. Although not shown, the materials of layer 12 for NMOS 96 and PMOS 97 may be different. And for any FET type (NMOS or PMOS), the layer 12 may consist of multiple stacks of materials. Of note is that although bulk type of substrate is shown here for the description of the invention, the invention is not limited to any specific substrate type. For example, the starting substrate for the invention can be of semiconductor-on-insulator (SOI) type having a buried insulator layer under a top layer of semiconductor.

The isolation regions or structures 14 are formed to electrically isolate the NMOS device area(s) 96 from the PMOS device area(s) 97. Isolation structures 14 define lateral boundaries of an active region or transistor region 96, 97 in active layer 12, and may be formed using any desired technique, such as selectively etching an opening in the second semiconductor layer 12 using a patterned mask or photoresist layer (not shown), depositing a dielectric layer (e.g., oxide) to fill the opening, and then polishing the deposited dielectric layer until planarized with the remaining second semiconductor layer 12. Any remaining undetached portions of the patterned mask or photoresist layer(s) are stripped.

Figure 3:
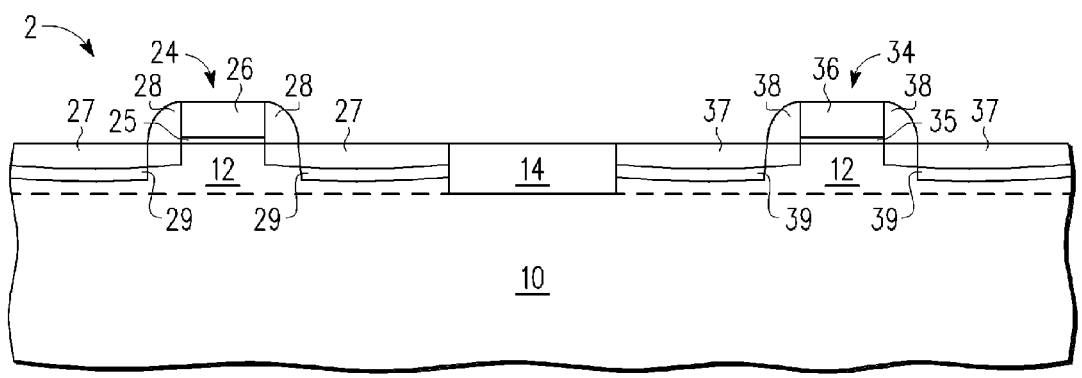
FIG. 3 illustrates processing subsequent to FIG. 2 after NMOS and PMOS FET devices are formed in the NMOS and PMOS areas.

FIG. 3 illustrates processing of a semiconductor wafer structure 2 subsequent to FIG. 2 after NMOS transistor(s) 24 and PMOS transistor(s) 34 are formed in the NMOS and PMOS areas 96, 97, respectively. As illustrated, NMOS transistor 24 includes one or more gate dielectric layers 25, a conductive gate electrode 26 overlying the gate dielectric 25, sidewall implant spacers 28 formed from one or more dielectric layers on the sidewalls of gate electrode 26, and source/drain regions 27, 29 formed in the NMOS active layer 12. In similar fashion, PMOS transistor 34 includes one or more gate dielectric layers 35, a conductive gate electrode 36 overlying the gate dielectric 35, sidewall implant spacers 38 formed from one or more dielectric layers on the sidewalls of gate electrode 36, and source/drain regions 37, 39 formed in the PMOS active layer 12. Gate dielectric layer(s) 25, 35 may be formed by depositing or growing an insulator or high-k dielectric (e.g., silicon dioxide, oxynitride, metal-oxide, nitride, etc.) over the NMOS and PMOS substrate layers 12 using chemical vapor deposition (CVD), plasma-enhanced chemical vapor deposition (PECVD), physical vapor deposition (PVD), atomic layer deposition (ALD), thermal oxidation, or any combination(s) of the above to a predetermined final thickness in the range of 0.1-10 nanometers, though other thicknesses may be used. Conductive gate electrodes 26, 36 may be a heavily doped (n+) polysilicon gate electrode, a metal gate electrode, or a combination thereof that is formed using any desired deposition or sputtering process, such as CVD, PECVD, PVD, ALD, molecular beam deposition (MBD) or any combination(s) thereof to a predetermined final thickness in the range of 1-100 nanometers, though other thicknesses may be used. Sidewall implant spacers 28, 38 may be formed from an offset or spacer liner layer (e.g., a deposited or grown silicon oxide), alone or in combination with an extension spacer formed by depositing and anisotropically etching a layer of dielectric. Subsequent to forming at least the gate electrodes 26, lightly doped extension regions 27 may be formed by selectively masking the PMOS areas 97 to expose NMOS implant regions (not shown) and implanting n-type impurities into the exposed substrate layer 12, using the gate electrode(s) 26, alone or with an offset/spacer liner layer, as a implant mask to protect the NMOS channel from implantation. In addition or in the alternative, heavily doped source/drain regions 29 may be formed by selectively masking the PMOS area 97 to expose NMOS implant regions (not shown) and implanting n-type impurities into the exposed substrate layer 12, using the gate electrode(s) 26, alone or with an offset or spacer liner layer and/or implant spacer 28, as a implant mask to protect the NMOS channel from implantation. In similar fashion, the extension regions 37 and/or source/drain region 39 in the PMOS area 97 may be formed by implanting p-type impurities into the exposed substrate layer 12 in the PMOS area 97. Though not shown, it will be appreciated, that the NMOS and PMOS transistors may include silicide layers in the source/drain regions and gate electrodes. As described herein, any desired fabrication techniques may be used to grow, deposit, pattern, remove, etch or otherwise forming the various transistor device features.

Figure 4:
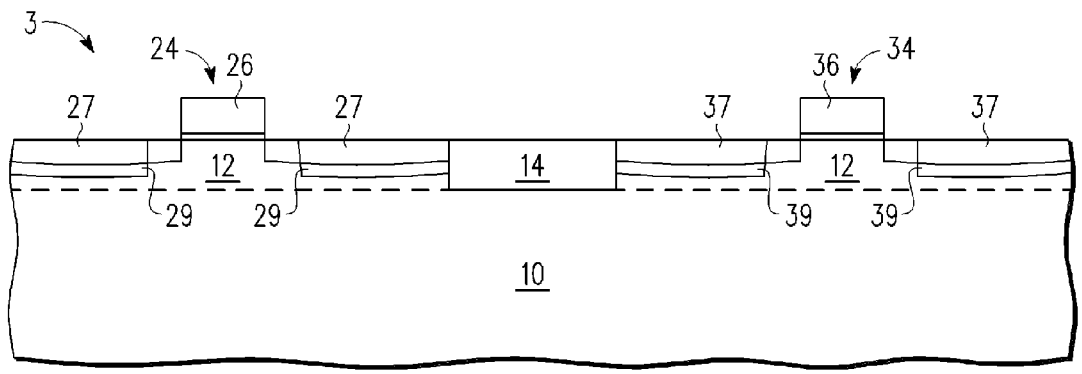
FIG. 4 illustrates processing subsequent to FIG. 3 after the implant spacers are removed from the NMOS and PMOS gates.

Referring now to FIG. 4, there is illustrated the processing of the semiconductor wafer structure 3 subsequent to FIG. 3 after the implant spacers 28, 38 are removed from the NMOS and PMOS gates 26, 36, thereby exposing the gate sidewalls. As will be appreciated, any desired selective etch technique may be used to remove the implant spacers 28, 38. For example, if the sidewall implant spacers 28, 38 are formed with silicon nitride, an oxide liner layer (not shown) may be grown over the semiconductor wafer structure 3 to protect the exposed substrate layer 12 and gates 26, 36, and then a etch chemistry or process may be applied that is selective to oxide so that only the nitride spacers 28, 38 are removed from the sidewalls of the NMOS and PMOS gates 26, 36. The removal of the implant spacers 28, 38 serves the purpose of increasing the spacing between adjacent NMOS (or PMOS) transistor structures (not shown), where the presence of the relatively wide implant spacers with conventional processes caused voids to occur in the subsequently-formed stress contact etch stop layers.

Figure 5:
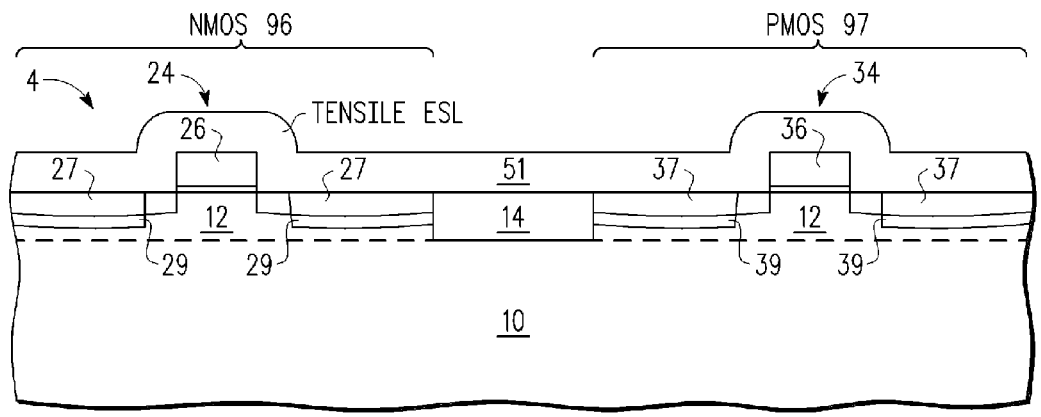
FIG. 5 illustrates processing subsequent to FIG. 4 after a first tensile stress contact etch stop layer is formed over the NMOS and PMOS FET devices in accordance with one or more first example embodiments.

FIG. 5 illustrates processing of the semiconductor wafer structure 4 subsequent to FIG. 4 after a first tensile stress contact etch stop layer 51 is formed over the NMOS and PMOS transistors 24, 34 in accordance with one or more first example embodiments. In selected embodiments, the tensile contact etch stop layer 51 is formed by depositing silicon nitride using a plasma-enhanced CVD technique to a thickness in the range of 400-1000 Angstroms, and more particularly approximately 600 Angstroms, though other materials and/or thicknesses may be used. For a silicon nitride layer, typically the Si—N to Si—H bonding influences whether there is stress and/or the stress type (tensile or compressive). Though not shown, a silicon oxide liner in the thickness range of 20-150 Angstroms may be deposited prior to the deposition of etch stop layer 51 for the purpose of better controlling of subsequent etch process.

Figure 6:
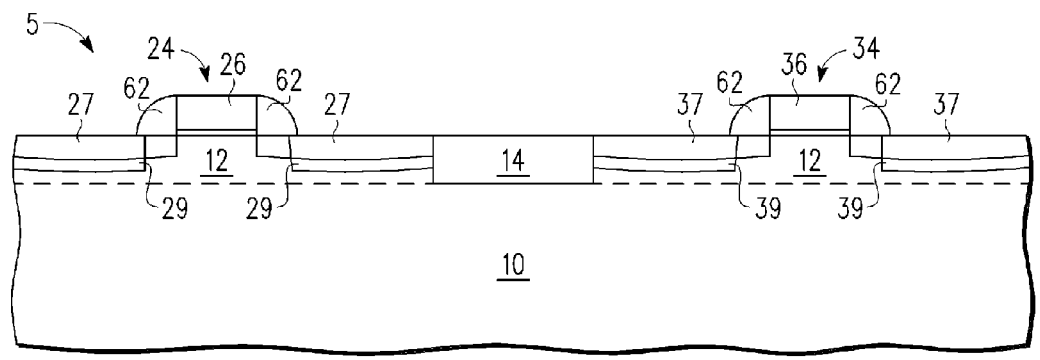
FIG. 6 illustrates processing subsequent to FIG. 5 after the first tensile stress contact etch stop layer is etched to form tensile spacers on the sidewalls of the NMOS and PMOS gates.

FIG. 6 illustrates processing of the semiconductor wafer structure 5 subsequent to FIG. 5 after the first tensile stress contact etch stop layer 51 is etched to form tensile sidewall spacers 62 on the sidewalls of the NMOS and PMOS gates 26, 36. As will be appreciated, any desired anisotropic or selectively directional etch technique may be used to form the tensile spacers 62, including a dry etching process such as reactive-ion etching, ion beam etching, plasma etching or laser etching or the like. The etch process is controlled to form tensile spacers 62 to have a controlled width having thickness in the range of 150-400 Angstroms, though other thicknesses may be used. As shown in FIG. 6, the tensile spacers 62 may be wider than the width of the previously-formed implant spacers 28, 29, provided that the thickness of the second etch stop layer (described below) is controlled to prevent voids being formed therein. As will be appreciated, as the thickness of the tensile sidewall spacers 62 increases, the tensile stressing also increases.

In the embodiments depicted in FIGS. 5 and 6, the deposition conditions (e.g., deposition rate, pressure, UV curing, and other factors known in the art) are controlled in such a way that there is tensile stress created within the first ESL layer 51 and in between the tensile spacers 62 and the underlying NMOS and PMOS channel regions. In selected embodiments, the first tensile stress contact etch stop layer 51 has a tensile stress of not less than approximately 0.3 Gap in magnitude. The tensile stress provided by the tensile spacers 62 in the presence of the NMOS channel regions improves the carrier mobility for the NMOS transistors 24.

Figure 7:
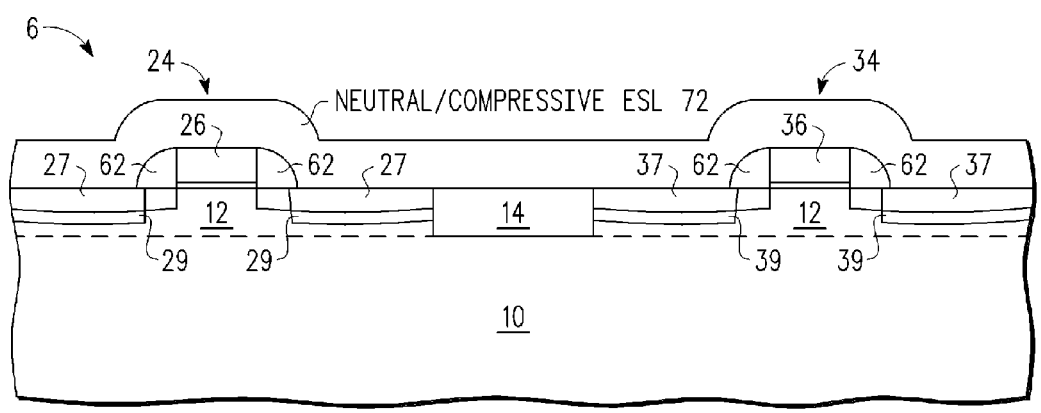
FIG. 7 illustrates processing subsequent to FIG. 6 after a void less neutral or compressive stress contact etch stop layer is formed over the NMOS and PMOS FET devices.

FIG. 7 illustrates processing of the semiconductor wafer structure 5 subsequent to FIG. 6 after a second, void less contact etch stop layer 72 is formed over the NMOS and PMOS transistors 24, 34 and tensile sidewall spacers 62. In selected embodiments, the second contact etch stop layer 72 is a relatively thin neutral or compressive layer formed by depositing silicon nitride using a plasma-enhanced CVD technique to a thickness in the range of 50-300 Angstroms, and more particularly approximately 200 Angstroms, though other materials and/or thicknesses may be used. By controlling the thickness of the second contact etch stop layer 72 to be relatively thin (e.g., less than 300 Angstroms), voids are not formed when the second contact etch stop layer 72 is deposited, even over closely spaced transistor structures. In the embodiments depicted in FIG. 7 where the stress layer 72 is formed, the deposition conditions (e.g., deposition rate, pressure, UV curing, and other factors known in the art) and film thickness are controlled in such a way that there is no stress or very small stress, or no more than 600 Map of compressive stress created within the ESL layer 72 and in between the layer 72 and the underlying NMOS and PMOS channel regions. Whether formed as a neutral or compressive layer, the composition of layer 72 is controlled to have relatively higher hydrogen content. For example, the hydrogen atomic percentage in layer 72 is at least 6%. Though not shown in the figures, it will be appreciated, that a thicker dielectric may be formed (e.g., deposited) over the stress contact etch stop layer to a predetermined thickness (e.g., approximately 3500 Angstroms).

At the point in the fabrication process shown in FIG. 7, the tensile sidewall spacers 62 are formed on the gate sidewalls of both the NMOS and PMOS transistors 24, 34, and provides tensile stressing for the NMOS channel regions, thereby enhancing mobility in the NMOS transistors 24. In addition, the second, relatively thin, void less contact etch stop layer 72 is formed over both the NMOS and PMOS transistors 24, 34, and acts as a source of hydrogen that helps recover the gate oxide integrity in the PMOS devices, thereby providing PMOS DIT improvement. In particular, the compressive or neutral contact etch stop layer 72 provides to enable hydrogen-assisted interface trap passivation by introducing hydrogen which passiveness surface dangling bonds of the channel semiconductor.

Figure 8:
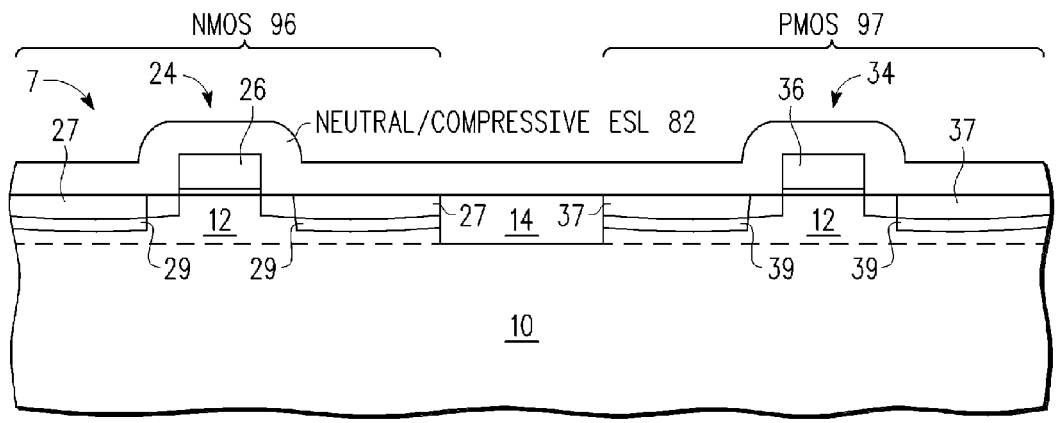
FIG. 8 illustrates processing subsequent to FIG. 4 after a first neutral or compressive stress contact etch stop layer is formed over the NMOS and PMOS FET devices in accordance with one or more second example embodiments.

In accordance with other embodiments, the performance of NMOS and PMOS transistors may be improved by using a single or common void less stressing structure for both PMOS and NMOS devices which is formed by first removing the implant spacer from the NMOS and PMOS transistor devices, and then forming neutral or compressive sidewall spacers on the NMOS and PMOS transistor devices, followed by formation of a tensile stress contact etch stop layer over the NMOS and PMOS transistor devices. For example, FIG. 8 illustrates processing of the semiconductor wafer structure 7 subsequent to FIG. 4 after a first neutral or compressive stress contact etch stop layer 82 is formed over the NMOS and PMOS transistors 24, 34 in accordance with one or more second example embodiments. In selected embodiments, the first contact etch stop layer 82 is a relatively thin neutral or compressive layer formed by depositing silicon nitride using a plasma-enhanced CVD technique to a thickness in the range of 100-400 Angstroms, and more particularly approximately 200 Angstroms, though other materials and/or thicknesses may be used. The composition of layer 82 is controlled to have relatively higher hydrogen content. For example, the hydrogen atomic percentage in layer 82 is higher than 6%. A silicon oxide liner in the thickness range of 20-150 Angstroms (not shown) may be deposited prior to the deposition of etch stop layer 82 for the purpose of better controlling of subsequent etch process.

Figure 9:
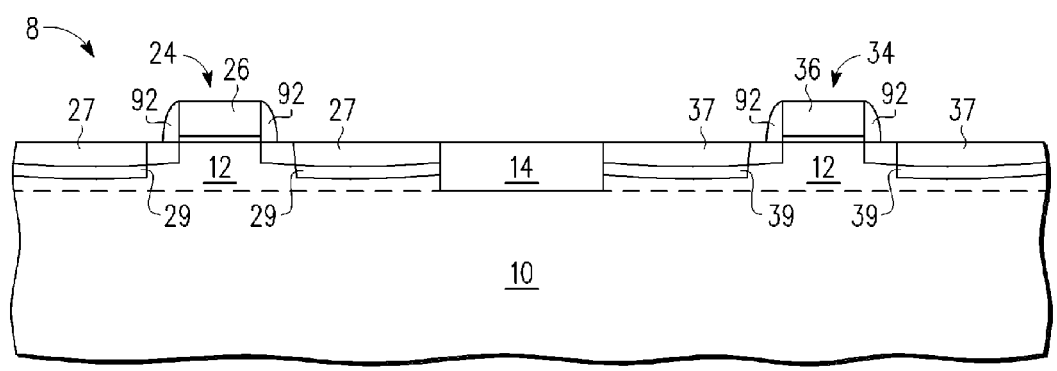
FIG. 9 illustrates processing subsequent to FIG. 8 after the first neutral or compressive stress contact etch stop layer is etched to form neutral or compressive spacers on the sidewalls of the NMOS and PMOS gates.

FIG. 9 illustrates processing of the semiconductor wafer structure 8 subsequent to FIG. 8 after the first neutral or compressive stress contact etch stop layer 82 is etched to form sidewall spacers 92 on the sidewalls of the NMOS and PMOS gates 26, 36. As will be appreciated, any desired anisotropic or selectively directional etch technique may be used to form the sidewall spacers 92, including a dry etching process such as reactive-ion etching, ion beam etching, plasma etching or laser etching or the like. The etch process is controlled to form sidewall spacers 92 to have a controlled width in the range of 50-200 Angstroms, and more particularly approximately 150 Angstroms, though other thicknesses may be used. As shown in FIG. 9, the sidewall spacers 92 may be narrower than the width of the previously-formed implant spacers 28, 29, provided that the thickness of the second etch stop layer (described below) is controlled to prevent voids being formed therein. In particular, by controlling the width of the sidewall spacers 92 to be relatively thin (e.g., approximately 150 Angstroms or less), the thickness of the second etch stop layer can be increased without forming voids therein.

In the embodiments depicted in FIGS. 8 and 9, the deposition conditions and the final spacer 92 size are controlled in such a way that there is no stress, or no more than 600 Map of stress created within the ESL layer sidewall spacers 92 and the underlying NMOS and PMOS channel regions. Whether formed with a compressive or neutral stress material, the sidewall spacers 92 provide a hydrogen source that enables hydrogen-assisted interface trap passivation for the gate oxide in the PMOS devices.

Figure 10:
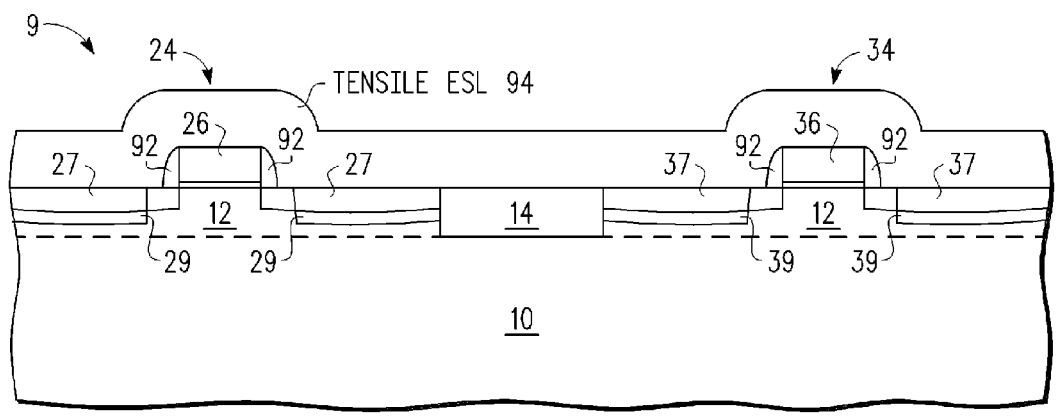
FIG. 10 illustrates processing subsequent to FIG. 9 after a void less tensile stress contact etch stop layer is formed over the NMOS and PMOS FET devices.

FIG. 10 illustrates processing of the semiconductor wafer structure 9 subsequent to FIG. 9 after a second, void less stress contact etch stop layer 94 is formed over the NMOS and PMOS transistors 24, 34 and sidewall spacers 92. In selected embodiments, the second contact etch stop layer 94 is a tensile layer formed by depositing silicon nitride using a plasma-enhanced CVD technique to a thickness in the range of 400-1000 Angstroms, and more particularly approximately 600 Angstroms, though other materials and/or thicknesses may be used. By controlling the thickness of the second contact etch stop layer 94 and forming the layer 94 on the relatively thin sidewall spacers 92 (e.g., approximately 150 Angstroms), voids are not formed when the second contact etch stop layer 94 is deposited, even over closely spaced transistor structures. In the embodiments depicted in FIG. 10 where the layer 94 is formed as a tensile stress layer, the deposition conditions are controlled so that the second tensile stress contact etch stop layer 94 has a tensile stress of not less than approximately 0.6 Gap in magnitude. In an even more particular embodiment, first ESL layer 51 has a tensile stress in a range of approximately 0.6 to approximately 3.0 Gap in magnitude, and more particularly 1.2 Gap. The tensile stress provided by the tensile layer 94 in the presence of the NMOS channel regions improves the carrier mobility for the NMOS transistors 24. Though not shown in the figures, it will be appreciated, that a thicker dielectric may be formed (e.g., deposited) over the stress contact etch stop layer to a predetermined thickness (e.g., approximately 3500 Angstroms).

At the point in the fabrication process shown in FIG. 10, the neutral or compressive sidewall spacers 92 are formed over both the NMOS and PMOS transistors 24, 34, and act as a source of hydrogen that helps recover the gate oxide integrity in the PMOS devices, thereby providing PMOS DIT improvement. In addition, the second, void less tensile contact etch stop layer 94 is formed over both the NMOS and PMOS transistors 24, 34, and provides tensile stressing for the NMOS channel regions, thereby enhancing mobility in the NMOS transistors 24. As a result, the PMOS transistor device 34 is formed over a semiconductor layer 12 having a <100> channel orientation, has a gate electrode 36 with neutral or compressive sidewall spacers 92 that act as a hydrogen source for the gate oxide, and is covered with a tensile stress contact etch stop layer 94, while the NMOS transistor 24 is formed over a semiconductor layer 12 having a <100> channel orientation, has a gate electrode 26 with neutral or compressive sidewall spacers 92, and is covered with a tensile stress contact etch stop layer 94 which causes the NMOS active region to exhibit uneasily tensile stress.

After forming the second contact etch stop layer 72, 94, the semiconductor wafer structure is completed into a functioning device. Examples of different processing steps which may be used to complete the fabrication of the depicted gate electrode structures into functioning transistors include, but are not limited to, one or more sacrificial oxide formation, stripping, extension implant, halo implant, spacer formation, source/drain implant, source/drain anneal, contact area solicitation, and polishing steps. In addition, conventional backend processing (not depicted) typically including multiple levels of interconnect is then required to connect the transistors in a desired manner to achieve the desired functionality. Thus, the specific sequence of steps used to complete the fabrication of the gate transistors 24, 34 may vary, depending on the process and/or design requirements.

By now, it should be appreciated that there has been provided herein a CMOS semiconductor fabrication process. As disclosed, a first semiconductor layer (e.g., silicon) is formed having a <100> channel orientation, and NMOS and PMOS gate structures, which may include a high-k dielectric and a metal gate electrode, are formed over the first semiconductor layer to define NMOS and PMOS transistor channel regions. Each of the NMOS and PMOS gate structures has exposed gate sidewalls that may be formed by selectively etching implant spacers from the sidewalls of the NMOS and PMOS gate structures that were used to form source/drain regions below the NMOS and PMOS gate structures. A first contact etch stop layer is deposited over the NMOS and PMOS gate structures, and then sidewall spacers are formed on or adjacent to the exposed gate sidewalls of the NMOS and PMOS gate structures from the first contact etch stop layer. The sidewall spacers may be formed by anisotropically etching the first contact etch stop layer to form tensile sidewall spacers that stress a channel region formed below the NMOS gate structure, where the tensile sidewall spacers have a width that is controlled to eliminate the formation of voids when the second contact etch stop layer is deposited. Alternatively, the sidewall spacers may be formed by anisotropically etching the first contact etch stop layer to form neutral or compressive sidewall spacers that introduce hydrogen to passivity surface dangling bonds of the channel semiconductor in a gate dielectric layer in the PMOS gate structure, where the neutral or compressive sidewall spacers have a width that is controlled to eliminate the formation of voids when the second contact etch stop layer is deposited. Thereafter, a second contact etch stop layer is deposited over the NMOS and PMOS gate structures and the sidewall spacers. As formed, one of the first or second contact etch stop layers is a tensile material and the other of the first or second contact etch stop layers is a compressive or neutral material that acts as a hydrogen source for a gate dielectric layer in the PMOS gate structures. Thus, when the first etch stop layer is a tensile layer, the second contact etch stop is a neutral or compressive contact etch stop layer, and when the first etch stop layer is a neutral or compressive layer, the second contact etch stop is a tensile contact etch stop layer.

In another form, there is provided a CMOS fabrication process for forming a semiconductor integrated circuit. As disclosed, a first semiconductor layer is formed that has a <100> channel orientation, and then PMOS and NMOS gate structures are formed over the first semiconductor layer to include implant spacers on the sidewalls of the PMOS and NMOS gate structures. In selected embodiments, the PMOS and NMOS gate structures are formed by forming metal gate electrodes over a high-k dielectric layer on the first semiconductor layer, and then forming implant spacers on the sidewalls of each metal gate electrode that are used to implant source/drain regions in the first semiconductor layer. After removing the implant spacers from the sidewalls of the PMOS and NMOS gate structures, sidewall spacers are formed on or adjacent to the sidewalls of the PMOS and NMOS gate structures, and then an etch stop layer is formed over the sidewall spacers and the PMOS and NMOS gate structures, where one of the sidewall spacers or the etch stop layer is formed with a tensile material and the other of the sidewall spacers or the etch stop layer is formed with a hydrogen-rich material. For example, the sidewall spacers may be formed by depositing a tensile silicon nitride layer over the NMOS and PMOS gate structures, and then anisotropically etching the tensile silicon nitride layer to form tensile sidewall spacers that stress a channel region formed below each NMOS gate structure, where the tensile sidewall spacers have a width (e.g., approximately 150-400 Angstroms) that is controlled to eliminate the formation of voids when an etch stop layer is subsequently formed, such as by depositing a layer of silicon nitride having an atomic percentage of at least six percent hydrogen over the sidewall spacers and the PMOS and NMOS gate structures. Alternatively, the sidewall spacers may be formed by depositing a hydrogen-rich silicon nitride layer over the NMOS and PMOS gate structures, and then anisotropically etching the hydrogen-rich silicon nitride layer to form sidewall spacers that act as a hydrogen source, where the sidewall spacers have a width (e.g., approximately 50-200 Angstroms) that is controlled to eliminate the formation of voids when the etch stop layer is subsequently formed, such as by depositing a tensile silicon nitride layer over the sidewall spacers and the PMOS and NMOS gate structures.

In yet another form, there is provided a semiconductor device and method for fabricating same, where the semiconductor device includes PMOS and NMOS gate structures overlying a semiconductor substrate having a <100> channel orientation, where first spacer structures are formed on or adjacent to sidewalls of the PMOS and NMOS gate structures after source/drain implantation. The semiconductor device also includes a contact etch stop layer formed over the first spacer structures and the PMOS and NMOS gate structures. As formed, either the first spacer structures or the contact etch stop layer is formed with a tensile material that stresses channel regions formed below the NMOS gate structures, and the other of the first spacer structures or the contact etch stop layer is formed with a hydrogen-rich material that introduces hydrogen to passivate surface dangling bonds of the channel semiconductor in the PMOS gate structures. In addition, the first spacer structures have a width that is controlled to eliminate the formation of voids when the contact etch stop layer is formed.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A CMOS semiconductor fabrication process, comprising:
   providing a first semiconductor layer;
   forming NMOS and PMOS gate structures overlying the first semiconductor layer, each of the NMOS and PMOS gate structures having exposed gate sidewalls;
   depositing a first contact etch stop layer over the NMOS and PMOS gate structures;
   anisotropically etching the first contact etch stop layer over the NMOS and PMOS gate structures to form sidewall spacers adjacent to the NMOS and PMOS gate structures;
   depositing a second contact etch stop layer over the NMOS and PMOS gate structures and the sidewall spacers;
   where one of the first or second contact etch stop layers is a tensile material and the other of the first or second contact etch stop layers is a compressive or neutral material that acts as a hydrogen source.

2. The process of claim 1, where forming a first semiconductor layer comprises forming a layer of silicon containing semiconductor with <100> channel orientation.

3. The process of claim 1, where forming NMOS and PMOS gate structures comprises selectively etching implant spacers from the sidewalls of the NMOS and PMOS gate structures, where the implant spacers were used to form source/drain regions below the NMOS and PMOS gate structures.

4. The process of claim 1, where depositing the first contact etch stop layer comprises depositing a tensile contact etch stop layer over the NMOS and PMOS gate structures.

5. The process of claim 4, where depositing the second contact etch stop layer comprises depositing a neutral or compressive contact etch stop layer over the NMOS and PMOS gate structures and the sidewall spacers.

6. The process of claim 1, where depositing the first contact etch stop layer comprises depositing a neutral or compressive contact etch stop layer over the NMOS and PMOS gate structures.

7. The process of claim 6, where depositing the second contact etch stop layer comprises depositing a tensile contact etch stop layer over the NMOS and PMOS gate structures and the sidewall spacers.

8. The process of claim 1, where the NMOS and PMOS gate structures each comprise a high-k dielectric and a metal gate electrode.

9. The process of claim 1, where anisotropically etching the first contact etch stop layer to form sidewall spacers comprises:
anisotropically etching the first contact etch stop layer to form tensile sidewall spacers that stress a channel region formed below the NMOS gate structure, where the tensile sidewall spacers have a width that is controlled to eliminate the formation of voids when the second contact etch stop layer is deposited.

10. The process of claim 1, where anisotropically etching the first contact etch stop layer to form sidewall spacers comprises:
anisotropically etching the first contact etch stop layer to form neutral or compressive sidewall spacers that introduce hydrogen to passivate surface dangling bonds in a channel semiconductor below the PMOS gate structure, where the neutral or compressive sidewall spacers have a width that is controlled to eliminate the formation of voids when the second contact etch stop layer is deposited.

11. A CMOS fabrication process for forming a semiconductor integrated circuit, comprising:
providing a first semiconductor layer having a <100>channel orientation;
forming PMOS and NMOS gate structures over the first semiconductor layer, where the PMOS and NMOS gate structures comprise implant spacers formed on sidewalls of the PMOS and NMOS gate structures;
removing the implant spacers from the sidewalls of the PMOS and NMOS gate structures;
forming sidewall spacers adjacent to the PMOS and NMOS gate structures by depositing a silicon nitride layer over the PMOS and NMOS gate structures and anisotropically etching the silicon nitride layer over the PMOS and NMOS gate structures to form sidewall spacers adjacent to the PMOS and NMOS gate structures; and
forming an etch stop layer over the sidewall spacers and the PMOS and NMOS gate structures;
where one of the sidewall spacers or the etch stop layer is formed with a tensile material and the other of the sidewall spacers or the etch stop layer is formed with a hydrogen-rich material.

12. The CMOS fabrication process of claim 11, where forming PMOS and NMOS gate structures comprises:
forming a plurality of metal gate electrodes over a high-k containing dielectric layer that is formed on the first semiconductor layer; and
forming implant spacers on the sidewalls of each metal gate electrode that are used to implant source/drain regions in the first semiconductor layer.

13. The CMOS fabrication process of claim 11, where forming sidewall spacers comprises:
depositing a first tensile silicon nitride layer over the NMOS and PMOS gate structures; and
anisotropically etching the first tensile silicon nitride layer to form tensile sidewall spacers that stress a channel region formed below each NMOS gate structure, where the tensile sidewall spacers have a width that is controlled to eliminate the formation of voids when the etch stop layer is formed.

14. The CMOS fabrication process of claim 13, where forming an etch stop layer comprises depositing a layer of silicon nitride having an atomic percentage of at least six percent hydrogen.

15. The CMOS fabrication process of claim 11, where forming sidewall spacers comprises forming tensile sidewall spacers having a controlled width with a thickness in the range of approximately 150-400 Angstroms.

16. The CMOS fabrication process of claim 11, where forming sidewall spacers comprises:
depositing a hydrogen-rich silicon nitride layer over the NMOS and PMOS gate structures; and
anisotropically etching the hydrogen-rich silicon nitride layer to form sidewall spacers that act as a hydrogen source, where the sidewall spacers have a width that is controlled to eliminate the formation of voids when the etch stop layer is formed.

17. The CMOS fabrication process of claim 16, where forming an etch stop layer comprises depositing a tensile silicon nitride layer over the sidewall spacers and the PMOS and NMOS gate structures.

18. The CMOS fabrication process of claim 11, where forming sidewall spacers comprises forming hydrogen-rich sidewall spacers having a controlled width with a thickness in the range of approximately 50-200 Angstroms.

* * * * *